(12) United States Patent
Choi et al.

(10) Patent No.: US 12,727,373 B2
(45) Date of Patent: Sep. 1, 2026

(54) APPARATUS FOR MANUFACTURING DISPLAY DEVICE

(71) Applicant: Samsung Display Co., Ltd., Yongin-Si (KR)

(72) Inventors: Woongil Choi, Yongin-si (KR); Hohyun Song, Incheon (KR)

(73) Assignee: Samsung Display Co., Ltd., Yongin-Si (KR)

( * ) Notice: Subject to any disclaimer, the term of this patent is extended or adjusted under 35 U.S.C. 154(b) by 153 days.

(21) Appl. No.: 18/820,265

(22) Filed: Aug. 30, 2024

(65) Prior Publication Data

US 2025/0081834 A1 Mar. 6, 2025

(30) Foreign Application Priority Data

Aug. 31, 2023 (KR) ........................ 10-2023-0115273

(51) Int. Cl.
*F16H 57/04* (2010.01)
*H10K 71/70* (2023.01)

(52) U.S. Cl.
CPC ......... *H10K 71/70* (2023.02); *F16H 57/0497* (2013.01)

(58) Field of Classification Search
CPC ............................ H10K 71/70; F16H 57/0497
See application file for complete search history.

(56) References Cited

U.S. PATENT DOCUMENTS

2010/0258770 A1* 10/2010 Nishitsuji .............. G01B 11/24 254/98
2025/0287826 A1* 9/2025 Park ....................... H10K 71/50

FOREIGN PATENT DOCUMENTS

| | | |
|---|---|---|
| KR | 10-0354480 B1 | 9/2002 |
| KR | 10-0650273 B1 | 11/2006 |
| KR | 10-2114799 B1 | 5/2020 |
| KR | 10-2308988 B1 | 10/2021 |

* cited by examiner

*Primary Examiner* — Joseph L Williams
(74) *Attorney, Agent, or Firm* — Innovation Counsel LLP

(57) ABSTRACT

Provided is an apparatus for manufacturing a display device, the apparatus including: a stage on which a display substrate is disposed; an inspecting portion disposed on the stage to inspect the display substrate; and a first horizontal moving portion configured to linearly move the stage in a first direction, wherein the first horizontal moving portion includes a lower module and an upper frame linearly moving in the first direction with respect to the lower module.

20 Claims, 11 Drawing Sheets

APPARATUS FOR MANUFACTURING DISPLAY DEVICE

CROSS-REFERENCE TO RELATED APPLICATION

This application is based on and claims priority under 35 U.S.C. § 119 to Korean Patent Application No. 10-2023-0115273, filed on Aug. 31, 2023, in the Korean Intellectual Property Office, the disclosure of which is incorporated by reference herein in its entirety.

BACKGROUND

1. Field

One or more embodiments relate to an apparatus, and more particularly, to an apparatus for manufacturing a display device.

2. Description of the Related Art

Generally, display devices can be used in mobile devices such as smartphones, laptop computers, digital cameras, camcorders, portable information terminals, laptops, and tablet personal computers, or electronic devices such as desktop computers, televisions (TVs), outdoor billboards, exhibition display devices, car instrument panels, and head-up displays (HUDs).

In display devices, a plurality of functional layers are formed on a substrate through various manufacturing processes. In manufacturing processes, there may be defects in the plurality of functional layers stacked on the substrate. Various inspection systems may be used to inspect these defects.

SUMMARY

One or more embodiments provide an apparatus for manufacturing a display device in which durability of the display device is improved and to which a lubricant may be easily supplied.

However, these features are illustrative, and the disclosure is not limited thereto.

Additional aspects will be set forth in part in the description which follows and, in part, will be apparent from the description, or may be learned by practice of the presented embodiments of the disclosure.

According to an aspect of the disclosure, an apparatus for manufacturing a display device includes a stage on which a display substrate is disposed, an inspecting portion disposed on the stage to inspect the display substrate, and a first horizontal moving portion configured to linearly move the stage in a first direction. The first horizontal moving portion includes a lower module and an upper frame linearly moving in the first direction with respect to the lower module. The lower module includes a frame portion providing a frame space, a ball screw portion of which at least part being disposed in the frame space and including a screw shaft extending in the first direction and a nut portion coupled to the screw shaft, a pair of rail portions extending in the first direction and fixed to the frame portion to be spaced apart from each other in a second direction crossing the first direction, a pair of first supports connected to the pair of rail portions so as to linearly move in the first direction, and a driving portion connected to the screw shaft to rotate the screw shaft around an axis extending in the first direction.

The upper frame includes a supply flow path simultaneously supplying a lubricant to each of the nut portion and the pair of first supports and is detachably connected to each of the nut portion and the pair of first supports.

As the driving portion rotates the screw shaft, the nut portion may linearly move in the first direction.

Power of the driving portion may be delivered in the order of the screw shaft, the nut portion, the upper frame, and the pair of first supports.

The supply flow path may include a first flow path, a second flow path diverged from the first flow path and connected to the nut portion, and a third flow path diverged from the first flow path and connected to each of the pair of first supports.

The first flow path may extend in the first direction, and the second flow path may extend in a third direction crossing the first direction and the second direction to communicate with the first flow path. The third flow path may include a $3^{rd}$-1 flow path extending in the second direction to communicate with the first flow path, and a pair of $3^{rd}$-2 flow paths each extending in the third direction from ends of the $3^{rd}$-1 flow path.

A crossing angle of the first flow path and the $3^{rd}$-1 flow path may include a right angle.

The nut portion may include a nut opening, which communicates with the second flow path and in which the lubricant is accommodated to be in contact with the screw shaft.

The pair of first supports may include a $1^{st}$-1 opening in which the pair of rail portions are accommodated, and a $1^{st}$-2 opening which is disposed on the $1^{st}$-1 opening and in which the lubricant is accommodated to be in contact with the pair of rail portions.

The lower module may further include a pair of second supports being spaced apart from the pair of first supports toward the first direction and being connected to the pair of rail portions to be linearly movable in the first direction.

The supply flow path may include a first flow path, a second flow path diverged from the first flow path and connected to the nut portion, and a fourth flow path diverged from the first flow path and connected to each of the pair of second supports.

The fourth flow path may include a $4^{th}$-1 flow path extending in the second direction to communicate with the first flow path, and a pair of $4^{th}$-2 flow paths extending from ends of the $4^{th}$-1 flow path in the third direction.

A crossing angle of the first flow path and the $4^{th}$-1 flow path may include a right angle.

The pair of second supports may include a $2^{nd}$-1 opening in which the pair of rail portions are accommodated, and a $2^{nd}$-2 opening, which is disposed on the $2^{nd}$-1 opening and in which the lubricant is accommodated to be in contact with the pair of rail portions.

The lower module may further include a plurality of stoppers fixed to the pair of rail portions to limit a movement of the pair of first supports.

The plurality of stoppers may include an urethane material.

The ball screw portion may include a plurality of balls between the screw shaft and the nut portion.

The inspecting portion may include an optical portion configured to inspect optical characteristics of the display substrate.

The inspecting portion may include a probe portion configured to inspect electrical characteristics of the display device.

The apparatus may further include a second horizontal moving portion configured to linearly move the stage in the second direction.

The apparatus may further include a rotation moving portion configured to rotate the stage around an axis extending in a third direction crossing the first direction and the second direction.

Other aspects, features, and advantages other than the above description will be clear from the details of the drawings, the claims, and the details of the description.

BRIEF DESCRIPTION OF THE DRAWINGS

The above and other aspects, features, and advantages of certain embodiments of the disclosure will be more apparent from the following description taken in conjunction with the accompanying drawings.

DETAILED DESCRIPTION

Figure 1:
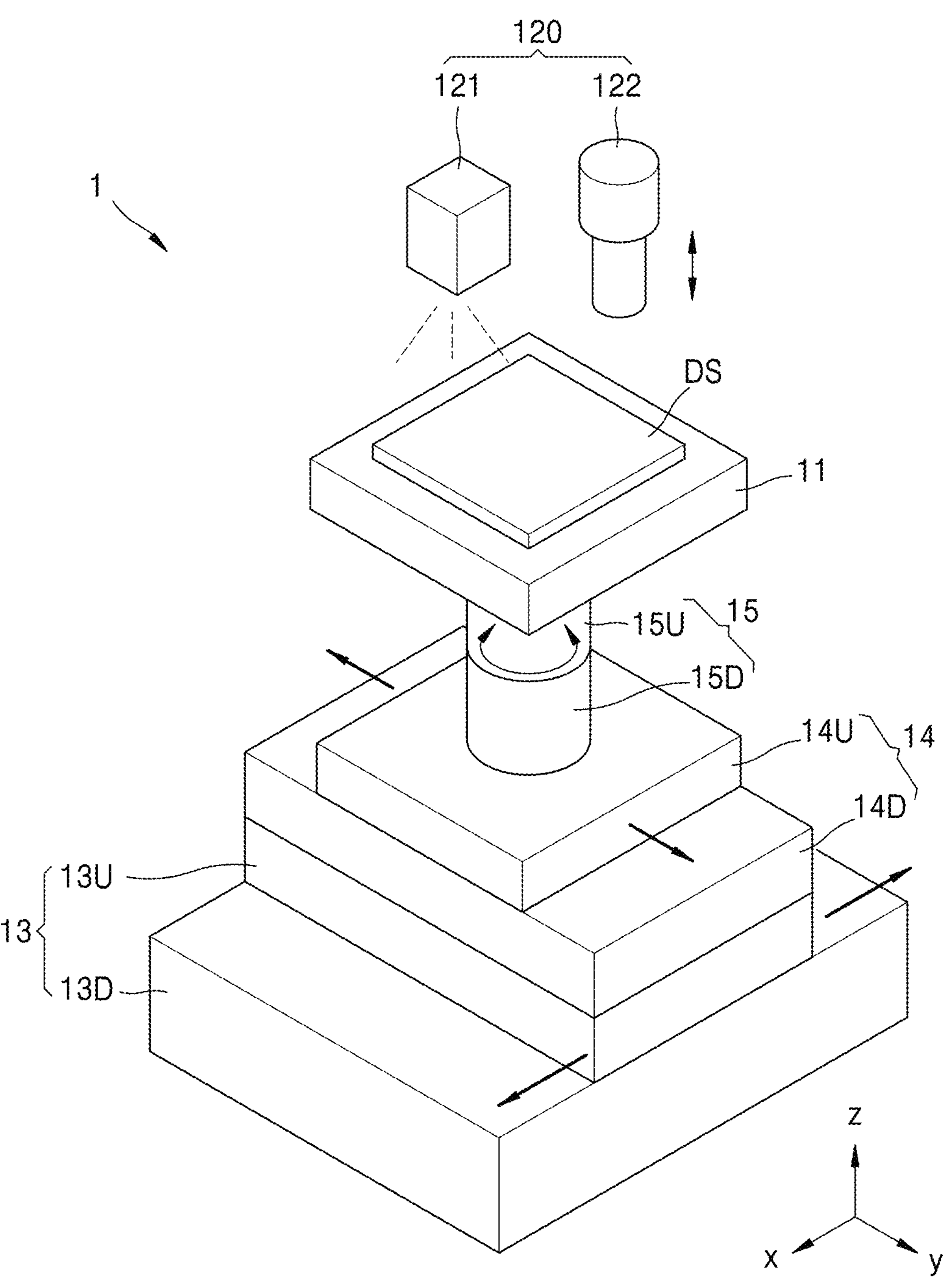
FIG. 1 is a perspective view schematically illustrating an apparatus for manufacturing a display device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Since various modifications and various embodiments of the present disclosure are possible, specific embodiments are illustrated in the drawings and described in detail in the detailed description. Effects and features of the present disclosure, and a method of achieving them will be apparent with reference to embodiments described below in detail in conjunction with the drawings. However, the present disclosure is not limited to the embodiments disclosed herein, but may be implemented in a variety of forms.

Hereinafter, embodiments of the present disclosure will be described in detail with reference to the accompanying drawings, and the same or corresponding components are denoted by the same reference numerals, and the same reference numerals are assigned and redundant explanations will be omitted.

In the following embodiments, the terms of the first and second, etc. were used for the purpose of distinguishing one element from other element s, not a limited sense.

In the following embodiments, the singular expression includes a plurality of expressions unless the context is clearly different.

In the following embodiments, the terms such as comprising or having are meant to be the features described in the specification, or the elements are present, and the possibility of one or more other features or elements will be added, is not excluded in advance.

In the following embodiments, when a portion such as a layer, a region, an element or the like is on other portions, this is not only when the portion is on other elements, but also when other elements are interposed therebetween.

In the drawings, for convenience of explanation, the sizes of elements may be exaggerated or reduced. For example, since the size and thickness of each component shown in the drawings are arbitrarily indicated for convenience of explanation, the present disclosure is not necessarily limited to the illustration.

In the following embodiments, the x-axis, the y-axis, and the z-axis are not limited to three axes on a Cartesian coordinate system, and may be interpreted in a broad sense including the same. For example, the x-axis, the y-axis, and the z-axis may be perpendicular to each other, but may refer to different directions that are not orthogonal to each other.

In the present specification, in the case where some embodiments may be implemented in the present specification, a specific process order may be performed differently from the order described. For example, two processes described in succession may be substantially performed at the same time, or in an opposite order to an order to be described.

FIG. 1 is a perspective view schematically illustrating an apparatus 1 for manufacturing a display device according to an embodiment.

Referring to FIG. 1, the apparatus 1 for manufacturing a display device may include a stage 11, an inspecting portion 120, a first horizontal moving portion 13, a second horizontal moving portion 14, and a rotation moving portion 15.

A display substrate DS may be disposed on the stage 11. The stage 11 may include a flat surface and may support a lower surface of the display substrate DS. In FIG. 1, planar shapes of the stage 11 and the display substrate DS are rectangular shapes. However, this is just one example, and shapes of the stage 11 and the display substrate DS are not limited thereto.

The inspecting portion 120 may be disposed on the stage 11 to inspect the display substrate DS. The inspecting portion 120 and the stage 11 may make a relative motion with respect to each other. For example, the stage 11 may be moved by the first horizontal moving portion 13, the second horizontal moving portion 14, and the rotation moving portion 15, so that the inspecting portion 120 and the stage 11 may make a relative motion with respect to each other. In an embodiment, the inspecting portion 120 may be moved by an additional moving device so that the inspecting portion 120 and the stage 11 may make a relative motion with respect to each other. The inspecting portion 120 may include an optical portion 121 and a probe portion 122.

The optical portion 121 may inspect optical characteristics of the display substrate DS. For example, the optical portion 121 may irradiate light toward the display substrate DS. For example, the optical portion 121 may include at least one of a monitor, a backlight unit, and a flash lighting. For example, light may include at least one of visible light, infrared rays, and ultraviolet rays. In an embodiment, the optical portion 121 may detect light reflected from the display substrate DS. For example, the optical portion 121 may include a light field camera. As a result, the optical portion 121 may determine the quality of the display device by obtaining four dimensional information about the display device.

The probe portion 122 may inspect electrical characteristics of the display device. The probe portion 122 may move toward the display substrate DS disposed on the stage 11 to be in direct contact with the display substrate DS. The probe portion 122 may inspect electrical characteristics of the display substrate DS by flowing a current through the display substrate DS. As a result, the probe portion 122 may determine the quality of the display device.

The first horizontal moving portion 13 may linearly move the stage 11 in a first direction (e.g., x direction and/or −x direction). The first horizontal moving portion 13 may include a lower portion 13D and an upper portion 13U. The upper portion 13U may be disposed on the lower portion 13D. The lower portion 13D may linearly move the upper portion 13U in the first direction (e.g., x direction and/or −x direction).

The second horizontal moving portion 14 may linearly move the stage 11 in a second direction (e.g., y direction and/or −y direction). The second direction (e.g., y direction and/or −y direction) may be a direction crossing the first direction (e.g., x direction and/or −x direction). The second horizontal moving portion 14 may include a lower portion 14D and an upper portion 14U. The upper portion 14U may be disposed on the lower portion 14D. The lower portion 14D may linearly move the upper portion 14U in the second direction (e.g., y direction and/or −y direction).

The rotation moving portion 15 may rotate the stage 11 around an axis extending in a third direction (e.g., z direction and/or −z direction). The third direction (e.g., z direction and/or −z direction) may be a direction crossing the first direction (e.g., x direction and/or −x direction) and the second direction (e.g., y direction and/or −y direction). The rotation moving portion 15 may include a lower portion 15D and an upper portion 15U. The upper portion 15U may be disposed on the lower portion 15D. The lower portion 15D may rotate the upper portion 15U clockwise and counter-clockwise around an axis extending in the third direction (e.g., z direction and/or −z direction).

The first horizontal moving portion 13, the second horizontal moving portion 14, the rotation moving portion 15, and the stage 11 may be detachably fixed to one another. For example, the second horizontal moving portion 14 may be disposed on the first horizontal moving portion 13, and the rotation moving portion 15 may be disposed on the second horizontal moving portion 14. The lower portion 13D of the first horizontal moving portion 13 may be fixed to the ground, the upper portion 13U of the first horizontal moving portion 13 and the lower portion 14D of the second horizontal moving portion 14 may be fixed to each other, the upper portion 14U of the second horizontal moving portion 14 and the lower portion 15D of the rotation moving portion 15 may be fixed to each other, and the upper portion 15U of the rotation moving portion 15 and the stage 11 may be fixed to each other. Thus, the stage 11 may be movable in the first direction (e.g., x direction and/or −x direction) and the second direction (e.g., y direction and/or −y direction) with respect to the ground and may be clockwise and counter-clockwise rotatable around an axis extending in the third direction (e.g., z direction and/or −z direction).

However, this is just an example, and the arrangement of the second horizontal moving portion 14 and the rotation moving portion 15 is not limited thereto. For example, the rotation moving portion 15 may be between the first horizontal moving portion 13 and the second horizontal moving portion 14. In an embodiment, the first horizontal moving portion 13 may be disposed on the rotation moving portion 15, and the second horizontal moving portion 14 may be disposed on the first horizontal moving portion 13.

Figure 2:
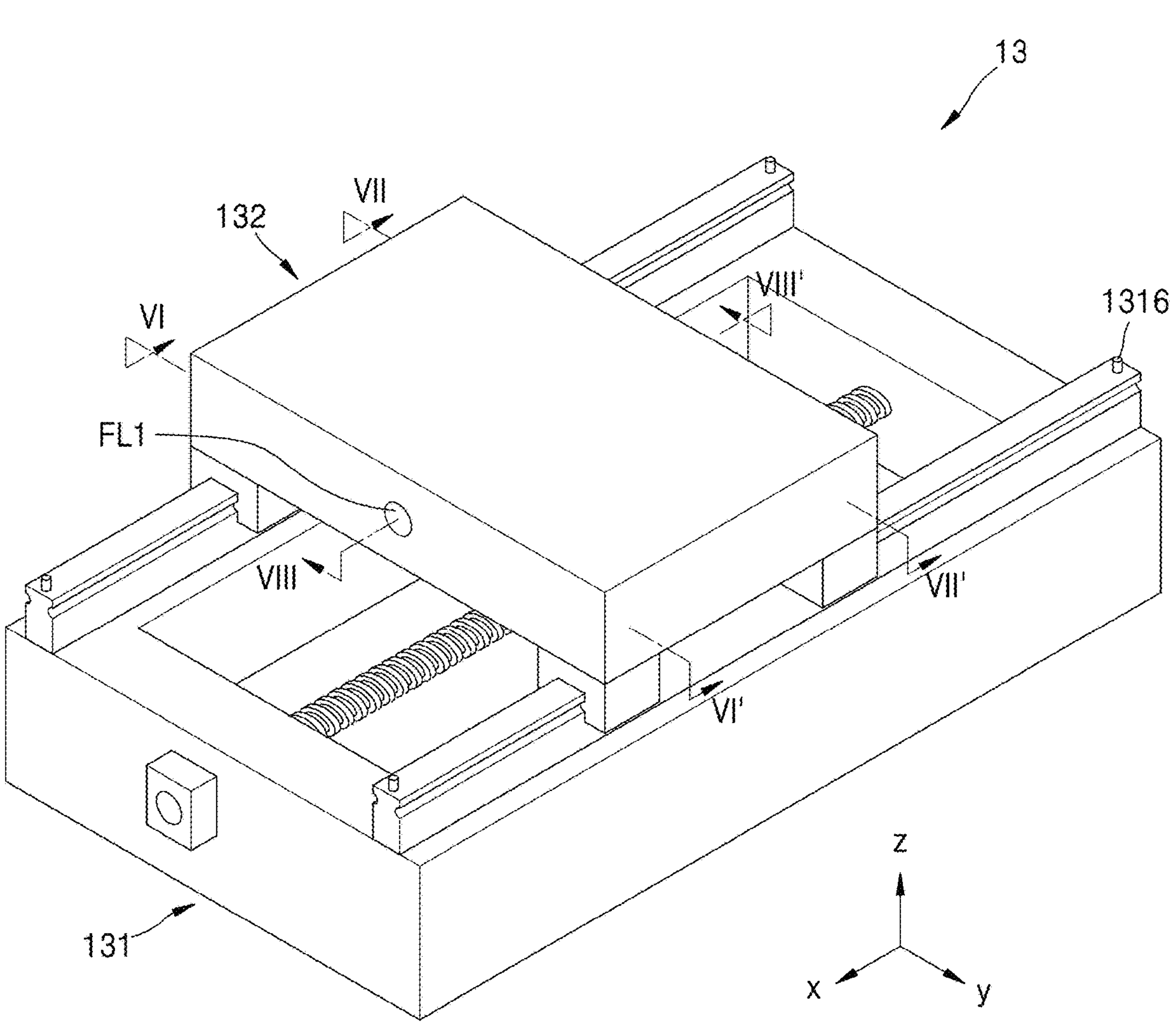
FIG. 2 is a perspective view schematically illustrating a first horizontal moving portion according to an embodiment.

FIG. 2 is a perspective view schematically illustrating the first horizontal moving portion 13 according to an embodiment.

Referring to FIG. 2, the first horizontal moving portion 13 may include a lower module 131 and an upper frame 132.

The upper frame 132 may be disposed on the lower module 131. The upper frame 132 may be detachably connected to the lower module 131. The upper frame 132 may linearly move in the first direction (e.g., x direction and/or −x direction) with respect to the lower module 131. The lower module 131 may provide power to the upper frame 132 so that the upper frame 132 may be moved.

The lower module 131 may correspond to the lower portion 13D of the first horizontal moving portion 13 described as above with reference to FIG. 1, and the upper frame 132 may correspond to the upper portion 13U of the first horizontal moving portion 13 described as above with reference to FIG. 1.

Figure 3:
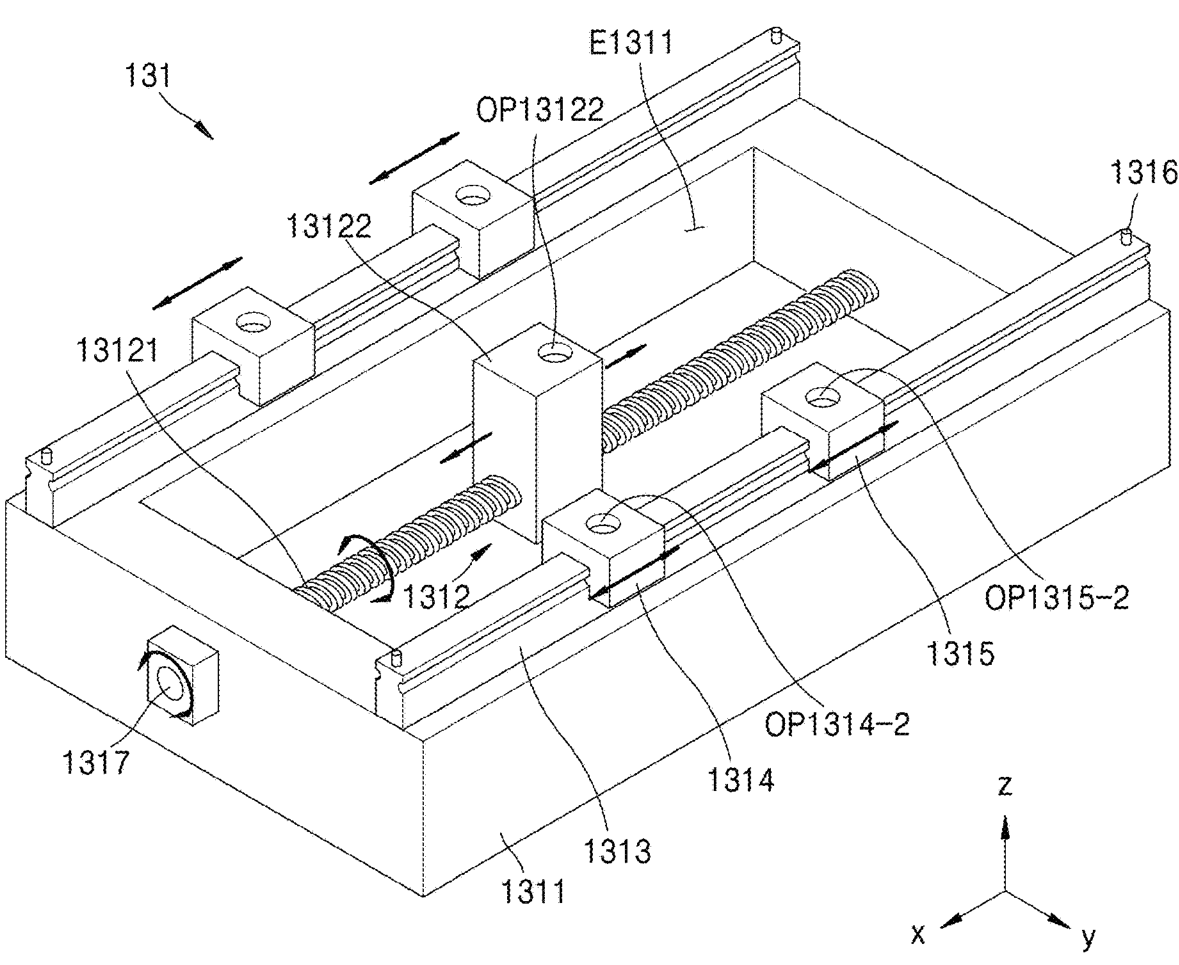
FIG. 3 is a plan view schematically illustrating a lower module according to an embodiment.
Figure 4:
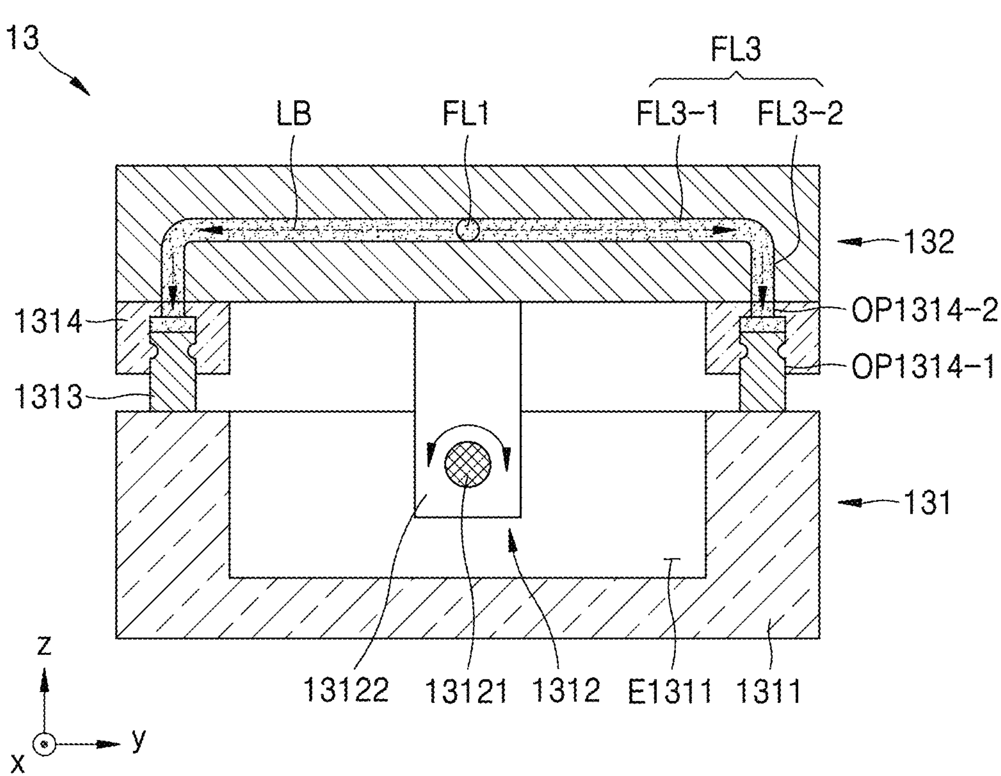
FIGS. 4, 5, and 6 are cross-sectional views schematically illustrating an apparatus for manufacturing a display device according to an embodiment.
Figure 5:
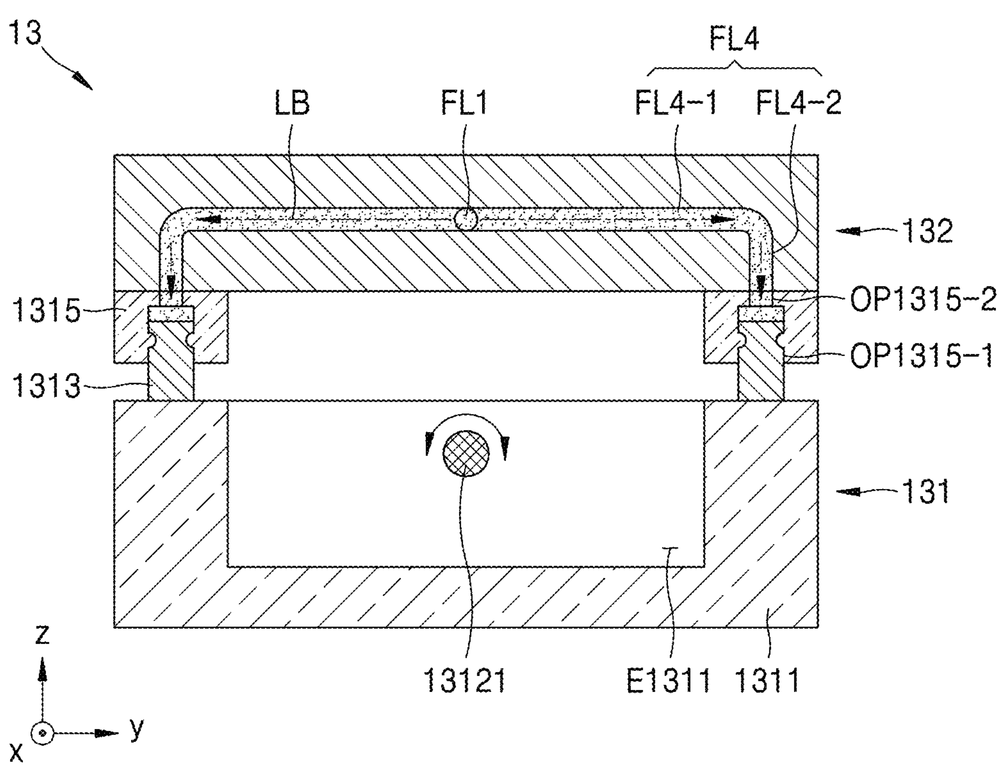
Figure 6:
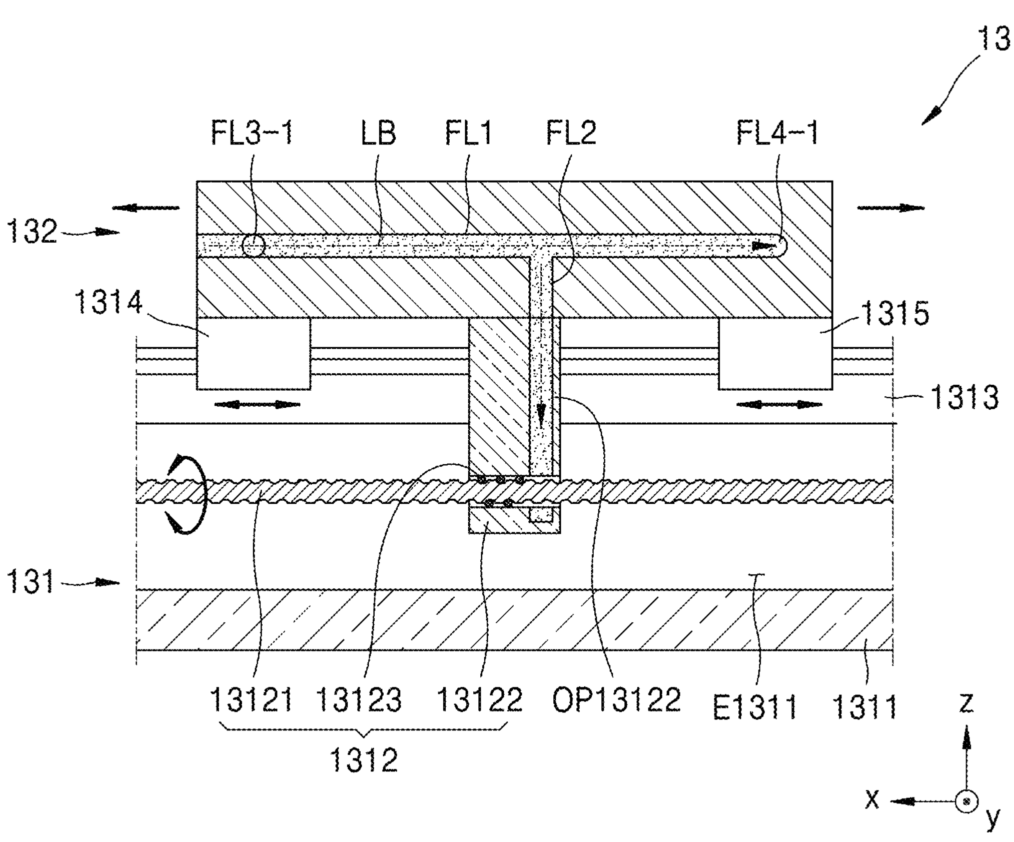

FIG. 3 is a perspective view schematically illustrating the lower module 131 according to an embodiment, and FIGS. 4 through 6 are cross-sectional views schematically illustrating the apparatus 1 for manufacturing the display device according to an embodiment.

Specifically, FIG. 4 may correspond to a portion VI-VI' of FIG. 2, FIG. 5 may correspond to a portion VII-VII' of FIG. 2, and FIG. 6 may correspond to a portion VIII-VIII' of FIG. 2.

First, referring to FIG. 3, the lower module 131 may include a frame portion 1311, a ball screw portion 1312, a pair of rail portions 1313, a pair of first supports 1314, a pair of second supports 1315, a plurality of stoppers 1316, and a driving portion 1317.

The frame portion 1311 may constitute the exterior of the lower module 131 and may provide a frame space E1311. The frame space E1311 may be disposed in the frame portion 1311. For example, the frame portion E1311 may be provided to be recessed from one surface of the frame portion 1311. Thus, one surface of the frame portion 1311 may be open.

Referring to FIGS. 3 and 6, at least part of the ball screw portion 1312 may be disposed in the frame space E1311. The ball screw portion 1312 may include a screw shaft 13121, a nut portion 13122, and a plurality of balls 13123.

The screw shaft 13121 may extend in the first direction (e.g., x-axis and/or −x axis direction). The screw shaft 13121 may cross the frame space E1311 to pass through the frame portion 1311. The screw shaft 13121 may rotate around an axis extending in the first direction (e.g., x-axis and/or −x-axis direction). An additional bearing may be disposed at a boundary between the screw shaft 13121 and the frame portion 1311 for smooth rotation of the screw shaft 13121. An outer surface of the screw shaft 13121 may have a shape of a male screw.

The nut portion 13122 may be accommodated in the frame space E1311 and coupled to the screw shaft 13121. The screw shaft 13121 may pass through the nut portion

13122. That is, part of the screw shaft 13121 may be accommodated in the nut portion 13122. An inner surface of the screw shaft 13121 in which part of the nut portion 13122 is accommodated, may have a shape of a female screw. The male screw formed on the outer surface of the screw shaft 13121 and the female screw formed on the inner surface of the nut portion 13122 may correspond to each other.

The plurality of balls 13123 may be accommodated in the nut portion 13122 and may be between the screw shaft 13121 and the nut portion 13122. That is, the plurality of balls 13123 may be in direct contact with each of the male screw formed on the outer surface of the screw shaft 13121 and the female screw formed on the inner surface of the nut portion 13122. The plurality of balls 13123 may be arranged so that a rolling motion may occur in the ball screw portion 1312. That is, a frictional force between the screw shaft 13121 and the nut portion 13122 that is generated as the screw shaft 13121 is driven, may be reduced.

As the screw shaft 13121 rotates around an axis extending in the first direction (e.g., x-axis and/or −x-axis direction), the nut portion 13122 may linearly move in the first direction (e.g., x-axis and/or −x-axis direction). For example, when the screw shaft 13121 rotates around an axis extending in the first direction (e.g., x-axis direction), the nut portion 13122 may move in the first direction (e.g., x-axis direction), and when the screw shaft 13121 rotates around an axis extending in the first direction (e.g., −x-axis direction), the nut portion 13122 may move in the first direction (e.g., −x-axis direction). In the above-described structure, the precision of movement of the nut portion 13122 may be enhanced. In addition, since a cross roller structure is not used, the durability of the apparatus 1 for manufacturing the display device may be enhanced.

The nut portion 13122 may include a nut opening OP13122 in which a lubricant LB is accommodated, to be in contact with the screw shaft 13121. The nut opening OP13122 may be recessed from one surface of the nut portion 13122. The nut opening OP13122 may communicate with the inner space of the nut portion 13122 through which the screw shaft 13121 passes. In a state in which the lubricant LB is accommodated in the nut opening OP13122, the lubricant LB may be in contact with an outer surface of the screw shaft 13121. Also, while the nut portion 13122 linearly moves with respect to the screw shaft 13121, the lubricant LB may be delivered to a boundary between the screw shaft 13121 and the nut portion 13122. That is, the lubricant LB may be smoothly supplied to the plurality of balls 13123. Also, as the lubricant LB is accommodated in the nut opening OP13122, a phenomenon that the lubricant LB may fall into the frame space E1311, may be reduced. Thus, a cleaning period for the apparatus 1 for manufacturing the display device may be extended, and the durability of the apparatus 1 for manufacturing the display device may be enhanced.

Referring back to FIG. 3, the pair of rail portions 1313 may extend in the first direction (e.g., x-axis and/or −x-axis direction) and may be fixed to the frame portion 1311 to be spaced apart from each other in the second direction (e.g., y-axis and/or −y-axis direction). For example, two rail portions 1313 may be provided in a pair. Two rail portions 1313 may be disposed to be in parallel to each other. The rail portions 1313 may not move relatively to the frame portion 1311 while being fixed to the frame portion 1311.

Referring to FIGS. 3 and 4, the pair of first supports 1314 may be connected to the pair of rail portions 1313 so as to linearly move in the first direction (e.g., x-axis and −x-axis direction). For example, two first supports 1314 may be provided in a pair. The pair of first supports 1314 may include a $1^{st}$-1 opening OP1314-1 and a $1^{st}$-2 opening OP1314-2.

The $1^{st}$-1 opening OP1314-1 may accommodate the pair of rail portions 1313. That is, in a state in which the pair of rail portions 1313 are accommodated in the $1^{st}$-1 opening OP1314-1, the pair of first supports 1314 may linearly move. As shown in FIGS. 3 and 4, a groove may be formed in the pair of rail portions 1313, and a protruding portion corresponding to the groove may be formed in the pair of first supports 1314 that contact the pair of rail portions 1313. Thus, a phenomenon that the pair of first supports 1314 deviate from the pair of rail portions 1313, may be reduced. However, this is just one example, and in an embodiment, a protruding portion may be formed in a pair of rail portions 1313, and a groove may be formed in a pair of first supports 1314.

The $1^{st}$-2 opening OP1314-2 may be disposed on the $1^{st}$-1 opening OP1314-1, and the lubricant LB may be accommodated in the $1^{st}$-2 opening OP1314-2 to be in contact with the pair of rail portions 1313. The $1^{st}$-2 opening OP1314-2 may be recessed from one surface of the first supports 1314. The $1^{st}$-2 opening OP1314-2 may communicate with the $1^{st}$-1 opening OP1314-1. In a state in which the lubricant LB is accommodated in the $1^{st}$-2 opening OP1314-2, the lubricant LB may be in contact with the pair of rail portions 1313. Thus, the lubricant LB may be delivered to a boundary between the pair of rail portions 1313 and the pair of first supports 1314. Thus, linear movement of the pair of first supports 1314 may be smoothly performed.

Also, as the lubricant LB is accommodated in the $1^{st}$-2 opening OP1314-2, a phenomenon that the lubricant LB may fall into the frame space E1311, may be reduced. Thus, a cleaning period for the apparatus 1 for manufacturing the display device may be extended, and the durability of the apparatus 1 for manufacturing the display device may be enhanced.

Referring to FIGS. 3 and 5, the pair of second supports 1315 may be connected to the pair of rail portions 1313 so as to linearly move in the first direction (e.g., x-axis and −x-axis direction). The pair of second supports 1315 may be spaced apart from the pair of first supports 1314 in the first direction (e.g., x-axis and/or −x-axis direction). For example, two second supports 1315 may be provided in a pair. The pair of second supports 1315 may include a $2^{nd}$-1 opening OP1315-1 and a $2^{nd}$-2 opening OP1315-2.

The $2^{nd}$-1 opening OP1315-1 may accommodate the pair of rail portions 1313. That is, in a state in which the pair of rail portions 1313 are accommodated in the $2^{nd}$-1 opening OP1315-1, the pair of second supports 1315 may linearly move. As shown in FIGS. 3 and 5, a groove may be formed in the pair of rail portions 1313, and a protruding portion corresponding to the groove may be formed in the pair of second supports 1315 that contact the pair of rail portions 1313. Thus, a phenomenon that the pair of second supports 1315 deviate from the pair of rail portions 1313, may be reduced. However, this is just one example, and in an embodiment, a protruding portion may be formed in the pair of rail portions 1313, and a groove may be formed in the pair of second supports 1315.

The $2^{nd}$-2 opening OP1315-2 may be disposed on the $2^{nd}$-1 opening OP1315-1, and the lubricant LB may be accommodated in the $2^{nd}$-2 opening OP1315-2 to be in contact with the pair of rail portions 1313. The $2^{nd}$-2 opening OP1315-2 may be recessed from one surface of the second supports 1315. The $2^{nd}$-2 opening OP1315-2 may communicate with the $2^{nd}$-1 opening OP1315-1. In a state in which the lubricant LB is accommodated in the $2^{nd}$-2 opening OP1315-2, the lubricant LB may be in contact with the pair of rail portions 1313. Thus, the lubricant LB may be delivered to a boundary between the pair of rail portions 1313 and the pair of second supports 1315. Thus, linear movement of the pair of second supports 1315 may be smoothly performed.

Also, as the lubricant LB is accommodated in the $2^{nd}$-2 opening OP1315-2, a phenomenon that the lubricant LB may fall into the frame space E1311, may be reduced. Thus, a cleaning period for the apparatus 1 for manufacturing the display device may be extended, and the durability of the apparatus 1 for manufacturing the display device may be enhanced.

The plurality of stoppers 1316 may be fixed to the pair of rail portions 1313 to limit a movement of at least one of the pair of first supports 1314 and the pair of second supports 1315. The plurality of stoppers 1316 may be provided to protrude from one surface of the pair of rail portions 1313. Four stoppers 1316 may be provided, and each of the four stoppers 1316 are arranged on both ends of two rail portions 1313. Thus, at least one of the pair of first supports 1314 and the pair of second supports 1315 may linearly move on the pair of rail portions 1313 before being in contact with one of the plurality of stoppers 1316.

The stoppers 1316 may include at least one material of urethane and plastics. Thus, a damage that occurs when at least one of the pair of first supports 1314 and the pair of second supports 1315 collide with the stoppers 1316, may be reduced. Thus, the durability of the apparatus 1 for manufacturing the display device may be enhanced.

Referring to FIGS. 2 and 3, the upper frame 132 may be detachably connected to each of the nut portion 1322, the pair of first supports 1314, and the pair of second supports 1315. The driving portion 1317 may be fixed to the frame portion 1311 and may provide power to the screw shaft 13121. Power of the driving portion 1317 may be delivered in the order of the screw shaft 13121, the upper frame 132, the pair of first supports 1314, and the pair of second supports 1315.

As the driving portion 1317 moves the screw shaft 13121, the nut portion 13122 may linearly move in the first direction (e.g., x-axis and/or −x-axis direction). As the nut portion 13122 linearly moves in the first direction (e.g., x-axis and/or −x-axis direction), the upper frame 132 fixed to the nut portion 13122 may linearly move in the first direction (e.g., x-axis and/or −x-axis direction). Also, the first supports 1314 and the second supports 1315 that are fixed to the upper frame 132 may linearly move in the first direction (e.g., x-axis and/or −x-axis direction). At this time, the first supports 1314 and the second supports 1315 may support the upper frame 132 so that the upper frame 132 may not be shaken but may stably linearly move.

Figure 7:
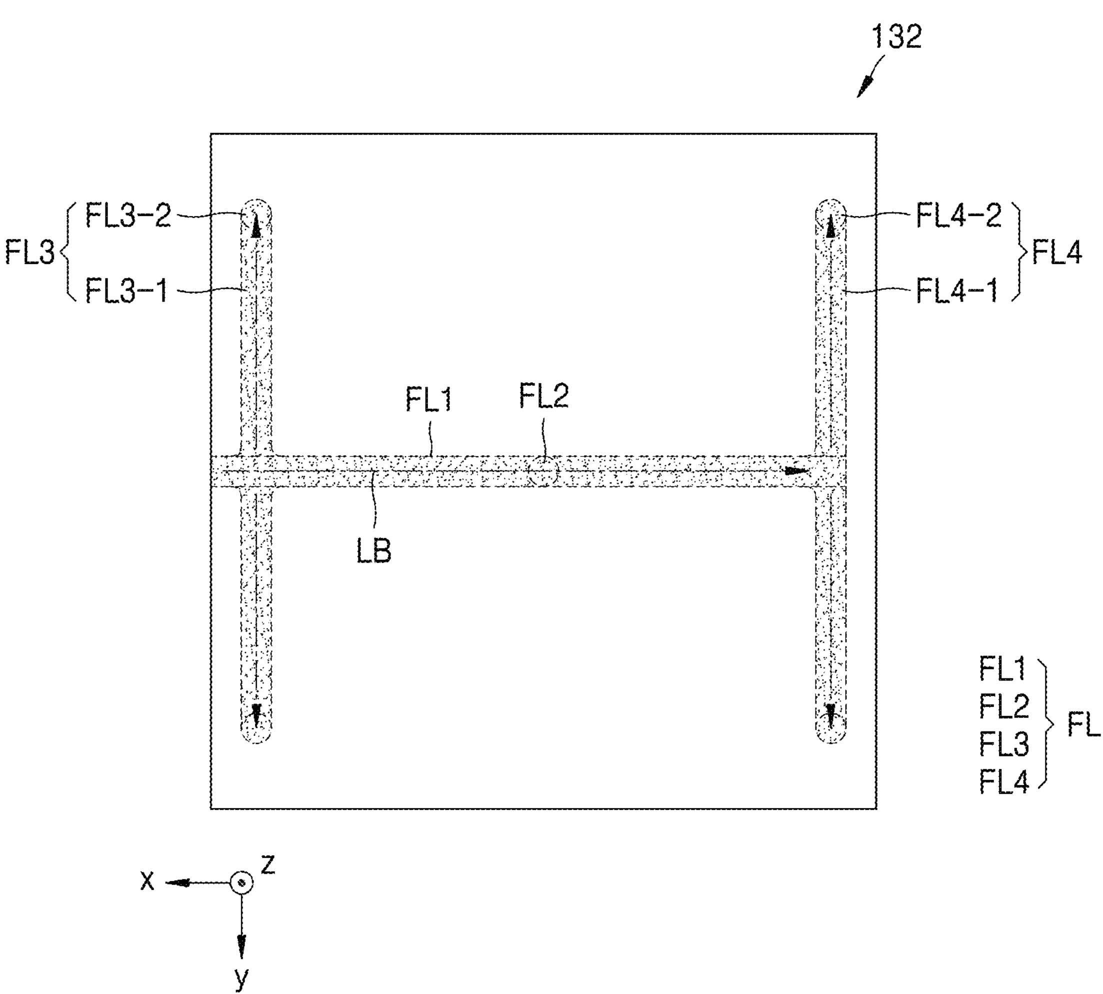
FIG. 7 is a top plan view of an upper frame according to an embodiment.
Figure 8:
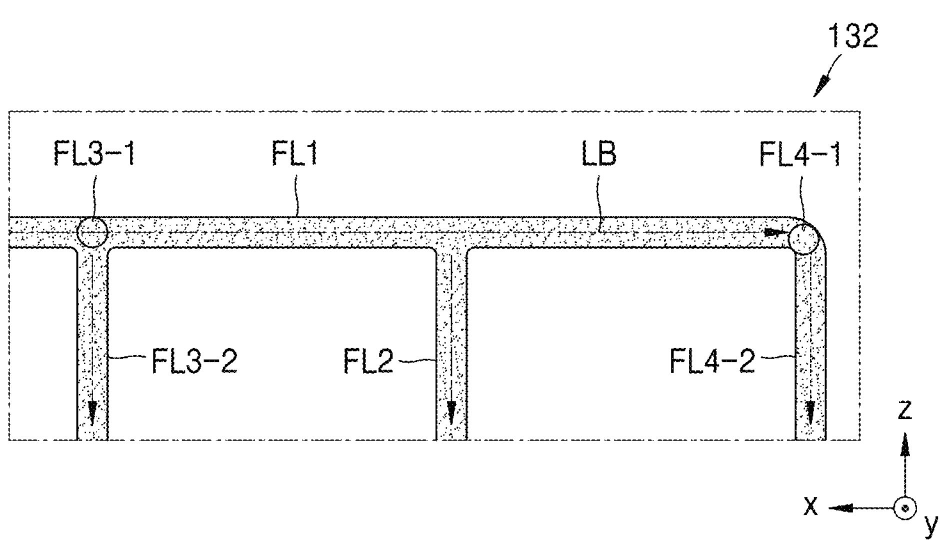
FIG. 8 is a side plan view of an upper frame according to an embodiment.

FIG. 7 is a top plan view of the upper frame 132 according to an embodiment, and FIG. 8 is a side plan view of the upper frame 132 according to an embodiment.

Referring to FIGS. 7 and 8, the upper frame 132 may include a supply flow path FL.

In FIGS. 7 and 8, the supply flow path FL is not seen from an outer surface of the upper frame 132. However, for convenience of explanation, the supply flow path FL is shown by dotted lines.

First, referring to FIGS. 7 and 8, the supply flow path FL may include a first flow path FL1, a second flow path FL2, a third flow path FL3, and a fourth flow path FL4.

The first flow path FL1 may extend in the first direction (e.g., x-axis and/or −x-axis direction) and may be recessed from one surface of the upper frame 132. The lubricant LB may be injected from the outside through the first flow path FL1.

The second flow path FL2 may be diverged from the first flow path FL1. The second flow path FL2 may extend in a third direction (e.g., z-axis and/or −z-axis direction) to communicate with the first flow path FL1.

The third flow path FL3 may be diverged from the first flow path FL1. The third flow path FL3 may include a $3^{rd}$-1 flow path FL3-1 and a $3^{rd}$-2 flow path FL3-2. The $3^{rd}$-1 flow path FL3-1 may extend in the second direction (e.g., y-axis and/or −y-axis direction) to communicate with the first flow path FL1. A crossing angle of the first flow path FL1 and the $3^{rd}$-1 flow path FL3-1 may be a right angle. The $3^{rd}$-2 flow path FL3-2 may extend in the third direction (e.g., z-axis and/or −z-axis direction) from both ends of the $3^{rd}$-1 flow path FL3-1.

The fourth flow path FL4 may be diverged from the first flow path FL1. The fourth flow path FL4 may include a $4^{th}$-1 flow path FL4-1 and a $4^{th}$-2 flow path FLA-2. The $4^{th}$-1 flow path FL4-1 may extend in the second direction (e.g., y-axis and/or −y-axis direction) to communicate with the first flow path FL1. A crossing angle of the first flow path FL1 and the $4^{th}$-1 flow path FL4-1 may be a right angle. The $4^{th}$-2 flow path FL4-2 may extend in the third direction (e.g., z-axis and/or −z-axis direction) from both ends of the $4^{th}$-1 flow path FL4-1.

Referring to FIGS. 4 through 8, the supply flow path FL may simultaneously supply the lubricant LB to each of the nut portion 13122, the pair of first supports 1314, and the pair of second supports 1315.

The second flow path FL2 may be connected to the nut portion 13122. Specifically, the second flow path FL2 may communicate with the nut opening OP13122 of the nut portion 13122. Thus, the lubricant LB introduced into the first flow path FL1 may flow into the nut opening OP13122 through the second flow path FL2.

The third flow path FL3 may be connected to each of the pair of first supports 1314. Specifically, each of the pair of $3^{rd}$-2 flow paths FL3-2 may communicate with the $1^{st}$-2 opening OP1314-2 of the pair of first supports 1314. Thus, the lubricant LB introduced into the first flow path FL1 may flow into the $1^{st}$-2 opening OP1314-2 through the $3^{rd}$-1 flow path FL3-1 and the $3^{rd}$-2 flow path FL3-2.

The fourth flow path FL4 may be connected to each of the pair of second supports 1315. Specifically, each of the pair of $4^{th}$-2 flow paths FL4-2 may communicate with the $2^{nd}$-2 opening OP1315-2 of the pair of second supports 1315. Thus, the lubricant LB introduced into the first flow path FL1 may flow into the $2^{nd}$-2 opening OP1315-2 through the $4^{th}$-1 flow path FL4-1 and the $4^{th}$-2 flow path FL4-2.

In the above-described structure, as the lubricant LB is introduced into the first flow path FL1, the lubricant LB may be simultaneously supplied to the ball screw portion 1312, the pair of first supports 1314, and the pair of second supports 1315. That is, the speed at which the lubricant LB is supplied to the apparatus 1 for manufacturing the display device, may be enhanced.

Figure 9:
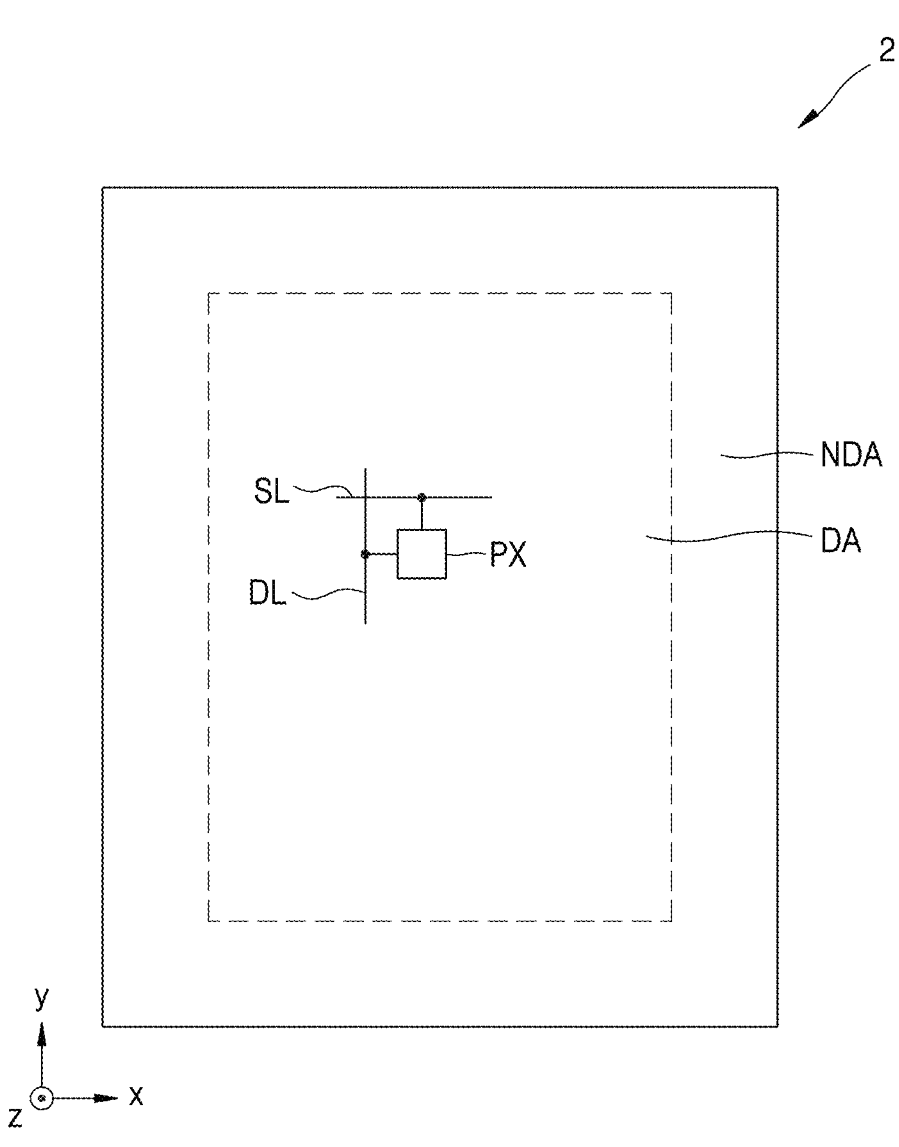
FIG. 9 is a plan view schematically illustrating a display device according to an embodiment.
Figure 10:
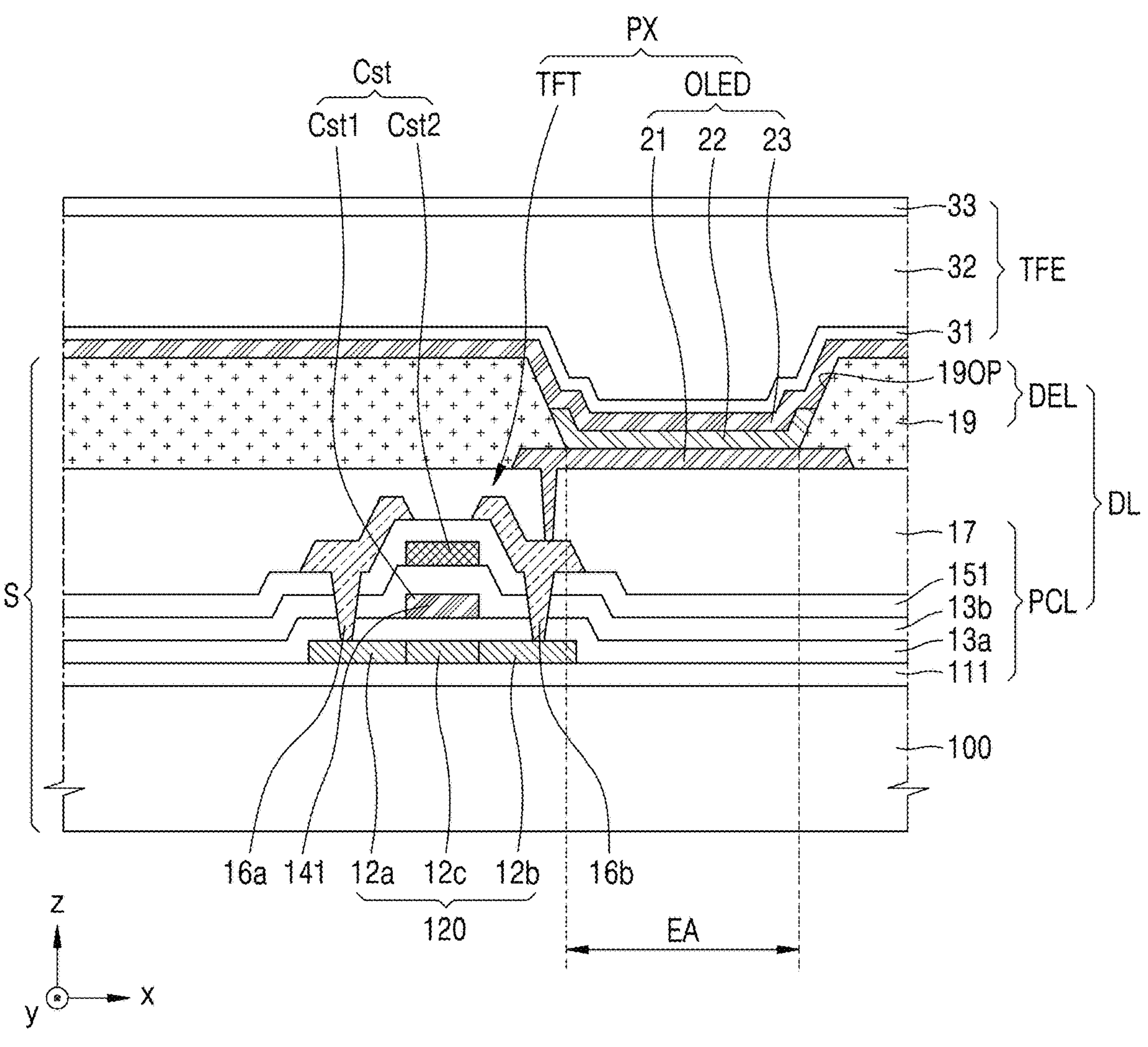
FIG. 10 is a cross-sectional view schematically illustrating a display device according to an embodiment.

FIG. 9 is a perspective view schematically illustrating a display device 2 according to an embodiment, and FIG. 10 is a cross-sectional view schematically illustrating the display device 2 according to an embodiment.

Referring to FIGS. 9 and 10, the display device 2 may include a display area DA for displaying an image and a non-display area NDA surrounding the display area DA. A pixel PX connected to a scan line SL and a data line DL may be included in the display area DA as discussed further below in reference to FIG. 11. The display device 2 may further include a display substrate S. The display substrate S may include a substrate 100, an intermediate layer of a display layer DL, and a layer excluding a common electrode 23.

The display layer DL and a thin-film encapsulation layer TFE may be arranged on the substrate 100. The display layer DL may include a pixel circuit layer PCL and a display element layer DEL.

The substrate 100 may include a glass or a polymer resin, such as polyethersulfone, polyacrylate, polyether imide, polyethylene naphthalate, polyethylene terephthalate, polyphenylene sulfide, polyarylate, polyimide, polycarbonate (PC), cellulose triacetate (TAC), or cellulose acetate propionate.

A barrier layer (not shown) may be further disposed between the display layer DL and the substrate 100. The barrier layer that is a barrier layer for preventing penetration of external foreign substances and may have a single layer or multi-layered structure including an inorganic material such as silicon nitride (SiNx) (where x>0) or silicon oxide (SiOx) (where x>0).

The pixel circuit layer PCL may be disposed on the substrate 100. The pixel circuit layer PCL may include a thin-film transistor TFT, and a buffer layer 111, a first insulating layer 13*a*, a second insulating layer 13*b*, a third insulating layer 151, and a planarization layer 17, which are arranged under or/and on components of the thin-film transistor TFT.

The buffer layer 111 may include an inorganic insulating material such as silicon nitride, silicon oxynitride, and silicon oxide, and may have a single layer or multi-layered structure including the inorganic insulating materials described above.

The thin-film transistor TFT may include a semiconductor layer 120, and the semiconductor layer 120 may include polysilicon. In an embodiment, the semiconductor layer 120 may include amorphous silicon, an oxide semiconductor, or an organic semiconductor, etc. The semiconductor layer 120 may include a channel region 12*c*, and a drain region 12*a* and a source region 12*b*, which are at both sides of the channel region 12*c*. A gate electrode 141 may overlap the channel region 12*c*.

The gate electrode 141 may include a low-resistance metal material. The gate electrode 141 may include a conductive material including molybdenum (Mo), aluminum (Al), copper (Cu), titanium (Ti), or the like, and may have a multi-layered or single layer structure including the materials described above.

The first insulating layer 13*a* between the semiconductor layer 120 and the gate electrode 141 may include an inorganic insulating material such as silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

The second insulating layer 13*b* may be provided to cover the gate electrode 141. The second insulating layer 13*b* may include an inorganic insulating material such as silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$), similarly to the first insulating layer 13*a*.

An upper electrode Cst2 of a storage capacitor Cst may be disposed above the second insulating layer 13*b*. The upper electrode Cst2 may overlap the gate electrode 141 thereunder. At this time, the gate electrode 141, and the upper electrode Cst2, which overlap each other with the second insulating layer 13*b* therebetween, may form the storage capacitor Cst. That is, the gate electrode 141 may function as a lower electrode Cst1 of the storage capacitor Cst.

In this way, the storage capacitor Cst and the thin-film transistor TFT may overlap each other. In some embodiments, the storage capacitor Cst may not overlap the thin-film transistor TFT.

The upper electrode Cst2 may include aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu), and may have a single layer or multi-layered structure including the materials described above.

The third insulating layer 151 may be provided to cover the upper electrode Cst2. The third insulating layer 151 may include an inorganic insulating material such as silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The third insulating layer 151 may have a single layer or multi-layered structure including the above-described inorganic insulating materials.

Each of a drain electrode 16*a* and a source electrode 16*b* may be located on the third insulating layer 151. The drain electrode 16*a* and the source electrode 16*b* may include a good conductive material. The drain electrode 16*a* and the source electrode 16*b* may include a conductive material including Mo, Al, Cu, Ti, or the like, and may have a multi-layered or single layer structure including the materials described above. In an embodiment, the drain electrode 16*a* and the source electrode 16*b* may have a multi-layered structure of Ti/Al/Ti.

The planarization layer 17 may include an organic insulating material. The planarization layer 17 may include general-purpose polymer such as polymethylmethacrylate (PMMA) or polystyrene (PS), a polymer derivative having a phenol-based group, acryl-based polymer, imide-based polymer, aryl ether-based polymer, amide-based polymer, fluorine-based polymer, p-xylene polymer, vinyl alcohol-based polymer, and an organic insulating material such as a blend thereof.

The display element layer DEL may be disposed on the pixel circuit layer PCL having the structure described above. The display element layer DEL may include an organic light-emitting diode OLED, and a pixel electrode 21 of the organic light-emitting diode OLED may be electrically connected to the thin-film transistor TFT through a contact hole defined in the planarization layer 17.

A pixel PX may include the organic light-emitting diode OLED and the thin-film transistor TFT. Each pixel PX may emit red, green or blue light, for example, through the organic light-emitting diode OLED, or emit red, green, blue or white light.

The pixel electrode 21 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). In an embodiment, the pixel electrode 21 may include a reflective layer including Ag, Mg, Al, Pt, Pd, Au, Ni, Nd, Ir, Cr, or a compound thereof. In an embodiment, the pixel electrode 21 may further include layers formed of ITO, IZO, ZnO or $In_2O_3$ on/under the above-described reflective layer.

A pixel-defining layer 19 having an opening 190P for exposing the center of the pixel electrode 21 may be disposed on the pixel electrode 21. The pixel-defining layer 19 may include an organic insulating material and an inorganic insulating material. The opening 190P may define an emission area (hereinafter, referred to as an emission area EA) of light emitted from the organic light-emitting diode OLED. For example, the width of the opening 190P may correspond to the width of the emission area EA.

A light-emitting layer 22 may be disposed in the opening 190P of the pixel-defining layer 19. The light-emitting layer 22 may include polymer or a low molecular weight organic material emitting light of a certain color. In an embodiment, the light-emitting layer 22 may include a quantum dot material. The light-emitting layer 22 may be formed by ejecting droplets into the apparatus 1 for manufacturing the display device according to an embodiment.

Although not shown, a first functional layer and a second functional layer may be arranged under and on the light-emitting layer 22. The first functional layer may include, for example, a hole transport layer (HTL) or a HTL and a hole injection layer (HIL). The second functional layer may be a component disposed on the light-emitting layer 22 and is optional. The second functional layer may include an electron transport layer (ETL) and/or an electron injection layer (EIL). The first functional layer and/or the second functional layer may be a common layer formed to entirely cover the substrate 100 similarly to the common electrode 23 to be described later.

The common electrode 23 may include a conductive material having a low work function. For example, the common electrode 23 may include a (semi-)transparent layer including Ag, Mg, Al, Pt, Pd, Au, Ni, Nd, Ir, Cr, Li, Ca or an alloy thereof. In an embodiment, the common electrode 23 may further include a layer such as ITO, IZO, ZnO or $In_2O_3$ on the (semi-)transparent layer including the above-described materials.

The thin-film encapsulation layer TFE may be disposed on the common electrode 23. In an embodiment, the thin-film encapsulation layer TFE may include at least one inorganic encapsulation layer and at least one organic encapsulation layer, and in an embodiment, FIG. 10 illustrates that the thin-film encapsulation layer TFE includes a first inorganic encapsulation layer 31, an organic encapsulation layer 32 and a second inorganic encapsulation layer 33, which are sequentially stacked.

The first inorganic encapsulation layer 31 and the second inorganic encapsulation layer 33 may include one or more inorganic materials among aluminum oxide, titanium oxide, tantalum oxide, hafnium oxide, zinc oxide, silicon oxide, silicon nitride, and silicon oxynitride. The organic encapsulation layer 32 may include a polymer-based material. The polymer-based material may include an acryl-based resin, an epoxy-based resin, polyimide, polyethylene, or the like. In an embodiment, the organic encapsulation layer 32 may include acrylate.

In an embodiment, the thin-film encapsulation layer TFE may have a structure in which the substrate 100 and an upper substrate as a transparent member are coupled to each other as a sealing member and an internal space between the substrate 100 and the upper substrate is sealed. At this time, moisture absorption or filling materials may be located in the inner space. The scaling member may be a sealant, and in an embodiment, the sealing member may include a material to be cured by laser. For example, the sealing member may be frit. Specifically, the sealing member may be an urethane-based resin, an epoxy-based resin, an acryl-based resin, which are organic sealants, or silicon that is an inorganic sealant. The urethane-based resin may be, for example, urethane acrylate or the like. The acryl-based resin may be, for example, buthylacrylate, ethylhexylacrylate, or the like. The sealing member may include a material to be cured by heat.

The display substrate DS described as above with reference to FIGS. 1 through 8 may include a display substrate S. That is, the display substrate DS described as above with reference to FIGS. 1 through 8 may include at least one of the substrate 100, the display layer DL, and the thin-film encapsulation layer TFE.

Figure 11:
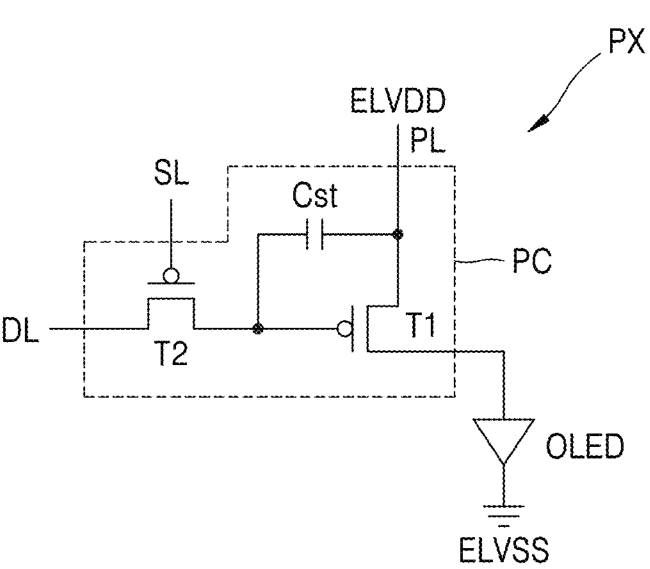
FIG. 11 is an equivalent circuit diagram of a pixel of a display device according to an embodiment.

FIG. 11 is an equivalent circuit diagram of a pixel of the display device 2 according to an embodiment.

Each pixel PX may include a pixel circuit PC, a display element connected to the pixel circuit PC, for example, an organic light-emitting diode OLED. The pixel circuit PC may include a first thin-film transistor T1, a second thin-film transistor T2, and a storage capacitor Cst. Each pixel PX may emit, for example, red, green, blue, or white light through the organic light-emitting diode OLED.

The second thin-film transistor T2 may be a switching thin-film transistor, may be connected to a scan line SL and a data line DL, and may be configured to transmit a data voltage input from the data line DL in response to a switching voltage input from the scan line SL to the first thin-film transistor T1. The storage capacitor Cst may be connected to the second thin-film transistor T2 and a driving voltage line PL and may store a voltage corresponding to a difference between a voltage transmitted from the second thin-film transistor T2 and a first power supply voltage ELVDD supplied to the driving voltage line PL.

The first thin-film transistor T1 may be a driving thin-film transistor, may be connected to the driving voltage line PL and the storage capacitor Cst, and may control a driving current flowing through the organic light-emitting diode OLED from the driving voltage line PL in response to a voltage value stored in the storage capacitor Cst. The organic light-emitting diode OLED may emit light having certain luminance by using the driving current. An opposite electrode (e.g., a cathode) of the organic light-emitting diode OLED may receive a second power supply voltage ELVSS.

FIG. 11 illustrates the case where the pixel circuit PC includes two thin-film transistors and one storage capacitor, and embodiments are not limited thereto. The number of thin-film transistors and the number of storage capacitors may be variously changed according to the design of the pixel circuit PC. For example, the pixel circuit PC may further include four, five or more thin-film transistors except for two thin-film transistors described above.

According to one or more embodiments, the durability of a display device and the speed of a manufacturing process of the display device may be enhanced.

The effects of the disclosure are not limited to the aforementioned features, and other effects not mentioned can be clearly understood by a person skilled in the art from the following description.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. An apparatus for manufacturing a display device, the apparatus comprising:

a stage on which a display substrate is disposed;

an inspecting portion disposed on the stage to inspect the display substrate; and a first horizontal moving portion configured to linearly move the stage in a first direction, wherein the first horizontal moving portion comprises:

a lower module; and an upper frame linearly moving in the first direction with respect to the lower module, and the lower module comprises:

a frame portion providing a frame space;

a ball screw portion of which at least part being disposed in the frame space and including a screw shaft extending in the first direction and a nut portion coupled to the screw portion;

a pair of rail portions extending in the first direction and fixed to the frame portion to be spaced apart from each other in a second direction crossing the first direction;

a pair of first supports connected to the pair of rail portions so as to linearly move in the first direction; and a driving portion connected to the screw shaft to rotate the screw shaft around an axis extending in the first direction, and the upper frame comprises a supply flow path simultaneously supplying a lubricant to each of the nut portion and the pair of first supports and is detachably connected to each of the nut portion and the pair of first supports.

2. The apparatus of claim 1, wherein, as the driving portion rotates the screw shaft, the nut portion linearly moves in the first direction.

3. The apparatus of claim 2, wherein power of the driving portion is delivered in an order of the screw shaft, the nut portion, the upper frame, and the pair of first supports.

4. The apparatus of claim 1, wherein the supply flow path comprises:

a first flow path;

a second flow path diverged from the first flow path and connected to the nut portion; and a third flow path diverged from the first flow path and connected to each of the pair of first supports.

5. The apparatus of claim 4, wherein the first flow path extends in the first direction, and the second flow path extends in a third direction crossing the first direction and the second direction to communicate with the first flow path, and the third flow path comprises:

a $3^{rd}$-1 flow path extending in the second direction to communicate with the first flow path; and a pair of $3^{rd}$-2 flow paths extending in the third direction from ends of the $3^{rd}$-1 flow path.

6. The apparatus of claim 5, wherein a crossing angle of the first flow path and the $3^{rd}$-1 flow path comprises a right angle.

7. The apparatus of claim 4, wherein the nut portion comprises a nut opening, which communicates with the second flow path and in which the lubricant is accommodated to be in contact with the screw shaft.

8. The apparatus of claim 4, wherein the pair of first supports comprise:

a $1^{st}$-1 opening in which the pair of rail portions are accommodated; and a $1^{st}$-2 opening, which is disposed on the $1^{st}$-1 opening and in which the lubricant is accommodated to be in contact with the pair of rail portions.

9. The apparatus of claim 1, wherein the lower module further comprises a pair of second supports being spaced apart from the pair of first supports in the first direction and being connected to the pair of rail portions to linearly move in the first direction.

10. The apparatus of claim 9, wherein the supply flow path comprises:

a first flow path;

a second flow path diverged from the first flow path and connected to the nut portion; and a fourth flow path diverged from the first flow path and connected to each of the pair of second supports.

11. The apparatus of claim 10, wherein the fourth flow path comprises:

a $4^{th}$-1 flow path extending in the second direction to communicate with the first flow path; and a pair of $4^{th}$-2 flow paths extending in the third direction from ends of the $4^{th}$-1 flow path.

12. The apparatus of claim 11, wherein a crossing angle of the first flow path and the $4^{th}$-1 flow path comprises a right angle.

13. The apparatus of claim 10, wherein the pair of second supports comprise:

a $2^{nd}$-1 opening in which the pair of rail portions are accommodated; and a $2^{nd}$-2 opening, which is disposed on the $2^{nd}$-1 opening and in which the lubricant is accommodated to be in contact with the pair of rail portions.

14. The apparatus of claim 1, wherein the lower module further comprises a plurality of stoppers fixed to the pair of rail portions to limit a movement of the pair of first supports.

15. The apparatus of claim 14, wherein the stoppers each comprises an urethane material.

16. The apparatus of claim 1, wherein the ball screw portion comprises a plurality of balls between the screw shaft and the nut portion.

17. The apparatus of claim 1, wherein the inspecting portion comprises an optical portion configured to inspect optical characteristics of the display substrate.

18. The apparatus of claim 1, wherein the inspecting portion comprises a probe portion configured to inspect electrical characteristics of the display device.

19. The apparatus of claim 1, further comprising a second horizontal moving portion linearly moving the stage in the second direction.

20. The apparatus of claim 1, further comprising a rotation moving portion rotating the stage around an axis extending in a third direction crossing the first direction and the second direction.

* * * * *